United States Patent
Matsinen

(10) Patent No.: US 8,424,320 B2
(45) Date of Patent: Apr. 23, 2013

(54) AIR DEHUMIDIFIER FOR FREQUENCY CONVERTER ARRANGEMENT

(75) Inventor: Jari-Pekka Matsinen, Vantaa (FI)

(73) Assignee: ABB Oy, Helsinki (FI)

( * ) Notice: Subject to any disclaimer, the term of this patent is extended or adjusted under 35 U.S.C. 154(b) by 1160 days.

(21) Appl. No.: 12/337,819

(22) Filed: Dec. 18, 2008

(65) Prior Publication Data

US 2009/0165473 A1 Jul. 2, 2009

(30) Foreign Application Priority Data

Dec. 27, 2007 (FI) ...................... 20075964

(51) Int. Cl.
*F25D 17/02* (2006.01)
*F25D 21/14* (2006.01)
*F25D 17/06* (2006.01)

(52) U.S. Cl.
USPC ............... 62/93; 62/94; 62/150; 62/176.5; 62/288; 165/48.1; 165/61

(58) Field of Classification Search ............ 62/93, 150, 62/94, 176.5, 176.6, 288; 165/230, 61, 64, 165/48.1, 58
See application file for complete search history.

(56) References Cited

U.S. PATENT DOCUMENTS

| | | | | |
|---|---|---|---|---|
| 1,863,576 A | * | 6/1932 | Morse et al. | 96/108 |
| 2,724,249 A | * | 11/1955 | Gravert | 62/181 |
| 3,159,211 A | * | 12/1964 | Miner | 165/233 |
| 4,428,205 A | | 1/1984 | Doderer | |
| 5,950,447 A | * | 9/1999 | Maeda et al. | 62/271 |
| 6,000,912 A | | 12/1999 | Takada et al. | |
| 6,205,805 B1 | * | 3/2001 | Takahashi et al. | 62/271 |
| 7,168,251 B1 | | 1/2007 | Janssen | |
| 2005/0002787 A1 | | 1/2005 | Wobben | |
| 2005/0092009 A1 | * | 5/2005 | Thurman | 62/289 |
| 2006/0137214 A1 | | 6/2006 | Achenbach | |
| 2006/0220386 A1 | | 10/2006 | Wobben | |
| 2007/0051123 A1 | * | 3/2007 | Matsui et al. | 62/324.5 |
| 2007/0074863 A1 | * | 4/2007 | Ichinose et al. | 165/247 |
| 2007/0261412 A1 | * | 11/2007 | Heine et al. | 62/3.4 |

FOREIGN PATENT DOCUMENTS

| | | |
|---|---|---|
| DE | 102 45 103 A1 | 4/2004 |
| DE | 103 10 036 A1 | 8/2004 |
| JP | 55-020384 | 2/1980 |
| JP | 07190530 A * | 7/1995 |
| JP | 2003-93829 A | 4/2003 |
| WO | WO 01/77526 A1 | 10/2001 |

OTHER PUBLICATIONS

European Search Report dated Mar. 17, 2011, issued in the corresponds European Application No. 08172119.3-1242.
Finnish Search Report for Application No. 20075964, dated Jul. 9, 2008.

* cited by examiner

*Primary Examiner* — Ljiljana Ciric
*Assistant Examiner* — Alexis Cox
(74) *Attorney, Agent, or Firm* — Buchanan Ingersoll & Rooney PC

(57) ABSTRACT

An air dehumidifier, and a method for dehumidifying, for a frequency converter arrangement including a surface to be cooled, on which humidity condenses when the surface is being cooled and when, at the same time, the inside of the frequency converter cabinet is possibly being heated. The air dehumidifier is positioned inside the frequency converter cabinet and including at least one air/liquid heat exchanger.

7 Claims, 1 Drawing Sheet

AIR DEHUMIDIFIER FOR FREQUENCY CONVERTER ARRANGEMENT

BACKGROUND OF THE INVENTION

Figure 1:
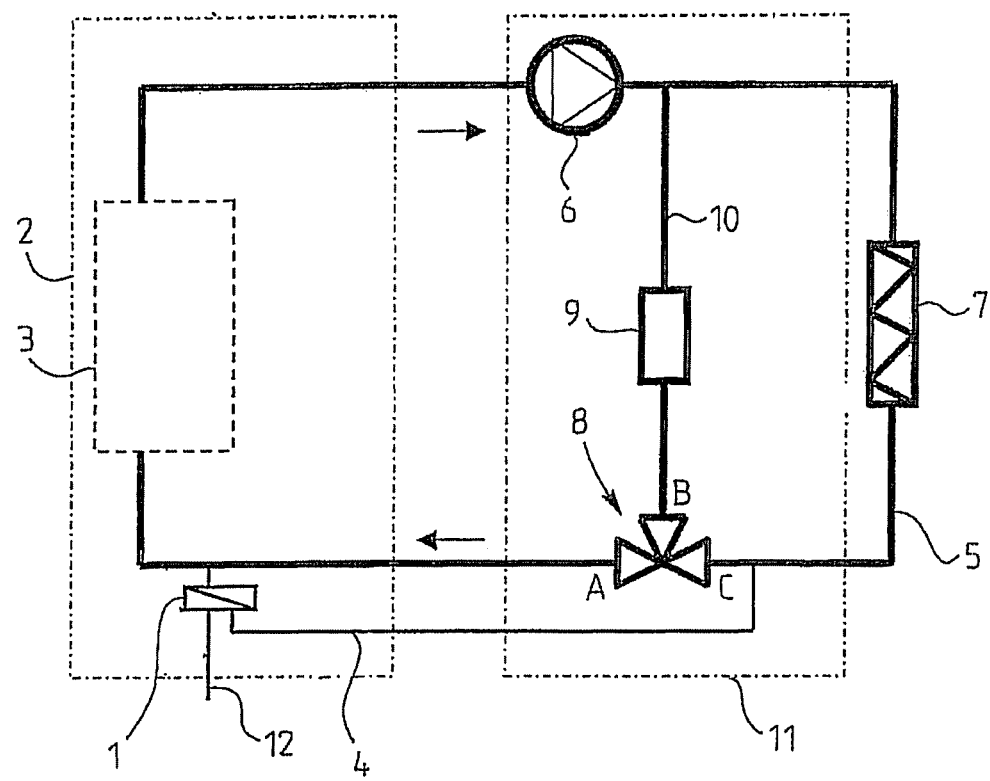

An air dehumidifier for a frequency converter arrangement, the air dehumidifier comprising a surface to be cooled, on which humidity condenses when the surface is being cooled and when, at the same time, the inside of the frequency converter is possibly being heated, whereby the air dehumidifier is positioned inside the frequency converter cabinet and it comprises at least one air/liquid heat exchanger. The invention also relates to a method for dehumidifying air in a frequency converter arrangement by using such an air dehumidifier.

Frequency converter arrangements or applications may be found in various branches of industry, such as ships, oil-drilling rigs and wind power stations. Some of the most demanding frequency converter applications are found at wind power stations often located on the coast, at sea or on mountains due to favorable wind conditions. In these places, wind power stations and also frequency converter applications are often subjected to humidity (fog), saltiness (maritime climate) and temperature variations (day/night). This also demands a lot from development work so that it would be possible to achieve reliability and the high expectations on service life.

Cabinets for frequency converter applications are conventionally designed to have a very high tightness level because of extreme environmental conditions imposed on them. However, cabinets are usually not made entirely pressure-sealed, since it would cause considerable costs.

Since a frequency converter cabinet is thus not pressure-sealed, different air pressure and temperature variations between air inside the cabinet and air outside the cabinet provide natural ventilation between the inside and outside air of the cabinet. Due to this, inside the cabinet dew point temperatures may be produced, at which humidity of the air condenses and accumulates inside the cabinet.

It is known that a high level of air humidity shortens the service time of electronic components and causes corrosion. Water that has condensed inside the cabinet may lead to problems with insulation resistance levels of electric components as well as to smaller air and creep gaps, which involves a greater risk of breakdown of live parts. Accordingly, this may cause that either a component or possibly the whole apparatus will be destroyed.

Publications DE 102 45 103 A1, US 2005/0002787 A1 and JP 2003 93829, for example, disclose some of the earlier air dehumidification methods in wind power station applications. What is common to these is that dehumidification is carried out by utilizing the operation of a Peltier element. However, the air dehumidification method based on a Peltier element does not provide a cost-efficient solution, because the element must be sized according to the volume of the area to be dried and the thermal stress directed to its environment. If the ambient temperature of the object to be dried and the relative air humidity are high, great thermal stress is applied to the cold surface of the Peltier element. As a result, the temperature difference between the hot and cold surfaces of the element becomes smaller, and at some operating points, the dehumidification capability of the element becomes weaker or does not exist anymore.

The dehumidification solution based on a Peltier element is also expensive and its operation requires a power source, by which a necessary cold surface is produced thereon for the drying. This sets great sealing demands on the Peltier element itself as wells on the supplying power source. Naturally, this increases the acquisition costs of the system considerably and, furthermore, the system does not use the energy efficiently in all environmental conditions. As to the service time, air dehumidification based on a Peltier element does not provide the optimal solution either, because of the electric components (power source, control logic) required by the system.

SUMMARY OF THE INVENTION

It is an object of the present invention to provide an efficient and quick drying of the inside of a frequency converter cabinet. This is achieved by an air dehumidifier of the invention, which is characterized in that the frequency converter arrangement is provided with liquid cooling, whereby the air dehumidifier is provided with a drying liquid circulation connected to a cooling liquid circulation of the frequency converter arrangement, which comprises, in the upstream direction of the cooling liquid circulation, a liquid pump, a heat exchanger and a valve arrangement outside the frequency converter cabinet, and a bypass circulation that starts from after the liquid pump and before the heat exchanger, leads to the valve arrangement past the heat exchanger and comprises a heating resistor, whereby the drying liquid circulation starts from the cooling liquid circulation between the valve arrangement and the heat exchanger. The method of the invention is characterized by what is stated in the characterizing part of claim 7.

The basic idea of the invention is that inside the frequency converter cabinet there is provided a liquid-circulated cooling element or piping, which is cooled to a dew point temperature during the drying, and the condensed water is then collected and removed from the cabinet.

High-power frequency converter applications usually consist of liquid-cooled solutions, whereby the system is provided with either an external or internal liquid circulation. With this liquid circulation, power losses of the frequency converter cabinet are transferred away efficiently without having to use great amounts of cooling air. The drying according to the invention utilizes the existing liquid circulation of the frequency converter without essentially increasing the costs of the system.

The structure of the dehumidifier is simple and reliable, because the number of electronic components is minimized. The dehumidifier may utilize thermal losses produced in the frequency converter cabinet and also work efficiently during the normal operation of the apparatus, and its energy consumption is low.

LIST OF FIGURES

Figure 2:
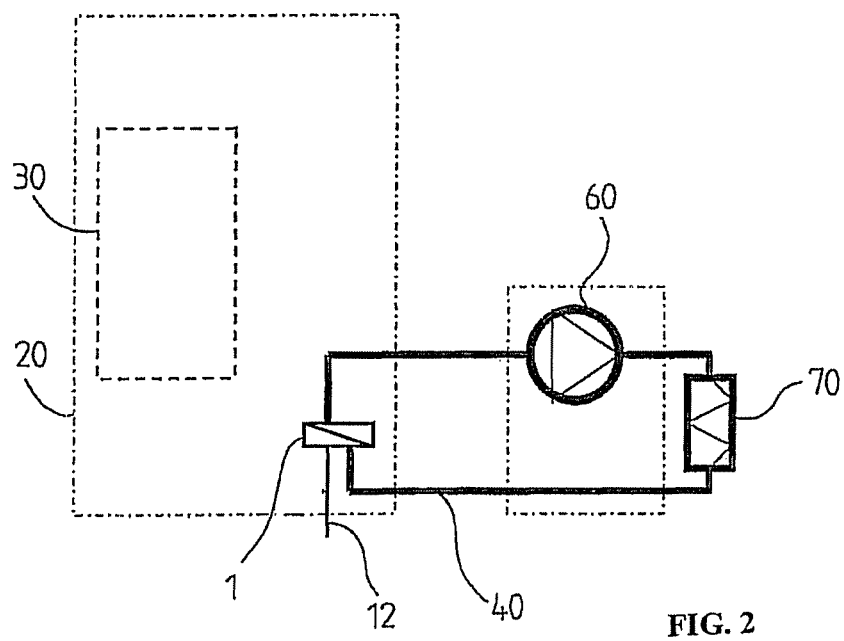

The invention will now be described in closer detail with reference to the attached drawings, in which FIG. 1 shows an air dehumidifier of the invention in a liquid-cooled frequency converter application; and FIG. 2 shows another air dehumidifier in an air-cooled frequency converter application.

DETAILED DESCRIPTION OF THE INVENTION

FIG. 1 shows an air dehumidifier 1 of the invention, which is positioned inside a frequency converter cabinet 2 and comprises at least one air/liquid heat exchanger. In this context, it deals with a liquid-cooled frequency converter arrangement 2, 3, whereby the air dehumidifier 1 is provided with a drying liquid circulation 4 connected to a cooling liquid circulation 5 of the frequency converter arrangement 2, 3, comprising in the upstream direction of the cooling liquid circulation 5 a liquid pump 6, a heat exchanger 7 and a valve arrangement 8 outside the frequency converter cabinet 2, and a bypass circulation 10 that starts from after the liquid pump 6 and before the heat exchanger 7, leads to the valve arrangement 8 past the heat exchanger 7 and comprises a heating resistor 9, whereby the drying liquid circulation 4 starts from the cooling liquid circulation 5 between the valve arrangement 8 and the heat exchanger 7. The valve arrangement 8 may consist of a three-way valve (flow routes A-B-C) or two two-way valves.

The cooling liquid circulation 5, the liquid pump 6, the heat exchanger 7, the valve arrangement 8 and the heating resistor 9 constitute a liquid station 11, which is located outside the frequency converter cabinet 2 in the above example. The liquid station 11 and the frequency converter cabinet 2 are connected to one another by the cooling liquid circulation 5, the purpose of which is to transfer the thermal losses of the frequency converter cabinet 2 to the heat exchanger 7 at the liquid station 4 and further remove them from there to the air surrounding the heat exchanger 7 or to the surrounding liquid, depending on the cooling manner of the heat exchanger 7.

The end of the drying liquid circulation 4 is directly connected to the cooling liquid circulation 5 immediately after the air dehumidifier 1 and before the frequency converter 3, whereby pressure losses caused by the drying liquid circulation 4 are minimized. On the other hand, the end of the air dehumidifier 1 could also be directly connected to the return side of the cooling liquid circulation 5 after the frequency converter 3 and before the liquid pump 6 to its suction side, because mass flow in the drying liquid circulation 4 is very weak and does not cause big pressure or flow losses in the cooling liquid circulation 5.

Humidity accumulated in the frequency converter cabinet 2 and its air is condensed on the surface of the dehumidifier 1 by setting a three-way valve 8 to a position A-B (route C is closed), starting the liquid pump 6 and activating the heating resistor 9. The majority of the liquid in the cooling liquid circulation 5 is heated while it passes through the heating resistor 9 and circulated through the three-way valve A-B to the cooling liquid circulation 5 of the frequency converter arrangement 2, 3. In this way, the mechanics of the frequency converter cabinet 2 and the inside air are heated to a desired level. The part of the liquid that passes through the drying liquid circulation 4 is cooled while it passes through the heat exchanger 7 of the cooling liquid circulation 5 to a temperature corresponding to that of the surroundings. Also the surface of the dehumidifier 1 then cools to correspond to this temperature.

If it deals with a water/air based heat exchanger 7 (ventilated by forced draught) of the cooling liquid circulation 5, the temperature of the liquid after the heat exchanger 7 always corresponds to at least that of the surrounding air. Correspondingly, if it deals with a water/water based heat exchanger 7 of the cooling liquid circulation, the liquid after the heat exchanger 7 has a temperature that corresponds to at least that of the cooling liquid circuit.

By controlling the temperature of air inside the frequency converter cabinet 2, the surface of the dehumidifier 1 will have a dew point temperature, at which air-bound water condenses and at which it may further be removed from the cabinet 2 by using, for instance, a discharge pipe 12 for condensation water. Alternatively, the condensation water may be collected in a gutter inside the cabinet 2, along which it is removed from the cabinet 2.

The drying capacity of the above-described system is proportional to the temperature of air inside the cabinet 2 and the surface temperature of the dehumidifier 1 connected to the drying liquid circulation 4. The bigger a temperature difference between these two temperatures is, the more efficient will be the drying capacity. For instance, if the temperature difference is 15° C., the inside air of the cabinet 2 may be dehumidified to correspond to air with a relative humidity of approximately 50% at an inside temperature of 60° C. The lower the air temperature inside the cabinet 2 is, the drier the inside air will get, if the temperature difference is kept constant.

The system may be implemented with simple control logic, also without electrical control components (capillary or bimetal sensors). The simplest control manner is to use a sensor based on a temperature difference and used for keeping the temperature difference between the temperature of the liquid in the drying liquid circulation 4 and that of the liquid in the cooling liquid circulation 5 of the cabinet 2 such that a dew point temperature is produced inside the cabinet 2. The drying of the cabinet 2 may be controlled by a sensor based on the relative humidity of air, or a dew point sensor, for example.

Control logic may also have an effect on the time when the object in question can most preferably be dried. For instance, in wind power station applications, the temperature variation of the environment can be utilized efficiently (day/night temperatures). At night, the temperature of the environment normally drops, whereby the cooling capacity of the heat exchanger 7 used at the liquid station 11 is high and, correspondingly, the temperature of the inside air of the cabinet 2 may be greatly increased by heating. Thus, the temperature difference is made quite big by efficient energy consumption, and the drying takes place quickly and efficiently.

Air dehumidification according to the invention is also efficient in the normal operation of the frequency converter arrangement 2, 3. The mechanics of the cabinet 2 and its inside air get warmer due to the cabinet's 2 own power losses, and the heating resistor 9 in the cooling liquid circulation 5 need not be activated at all and the liquid circulates in a flow circulated by the liquid pump 6 through the heat exchanger 7 and the flow route A-C of the valve arrangement 8. In this case, too, a small amount of liquid passes through the drying liquid circulation 4, thus forming a cold surface at the dehumidifier 1 inside the cabinet 2, on which surface the air-bound humidity condenses.

The air dehumidifier 1 also operates efficiently when the frequency converter 3 is switched off. It is sufficient that the flow route of the valve arrangement 8 is set to a position A-B, whereby the pump 6 of the liquid station 11 circulates liquid through both the frequency converter 3 and the drying liquid circulation 4, without needing to activate the heating resistor 9 at all.

The frequency converter application may also comprise an integrated cooling circuit, in which case the frequency converter application consists of both above-mentioned entities (the frequency converter arrangement 2, 3 and the liquid station 11).

The drying circulation described above may also be entirely separated. It may also include a liquid station and drying components but not a heat exchanger.

The implementation shown in FIG. 2 differs from the solution according to FIG. 1 in that the frequency converter arrangement 20, 30 is air-cooled, whereby the air dehumidifier 1 is provided with a drying liquid circulation 40, which comprises a liquid pump 60 and a heat exchanger 70 outside the frequency converter cabinet 20. The internal heating (not shown in the figure) of the frequency converter cabinet 20 may be carried out, for instance, by using a heating resistor, a heating blower or even a liquid-heated system according to FIG. 1. Control logic may be implemented in the same manner as in the above, i.e. with a control based on a temperature difference, with the exception that now the temperature difference is based on the surface temperature of the dehumidifier 1 connected to the drying liquid circulation 40 and the temperature of the air inside the cabinet 20. If desired, the liquid pump 60 may also be positioned in the frequency converter cabinet 20.

The air dehumidifier 1 of the invention and the method for using the same utilizes thermal losses produced in the cabinet 2, 20 efficiently and thus increases the efficiency of the entire system and substantially reduces the energy consumption.

The above specification is only intended to illustrate the basic idea according to the invention. A person skilled in the art may, however, vary its details within the scope of the appended claims. Thus, if necessary, there may be a plurality of air dehumidifiers in the same frequency converter cabin, even though this is not separately presented above.

The invention claimed is:

1. A cooling and dehumidification system for a frequency converter arrangement, comprising:
   an air dehumidifier for positioning inside a frequency converter cabinet, the air dehumidifier including a surface to be cooled for condensing humidity thereon, and a first heat exchanger;
   a liquid station, for arrangement outside the frequency converter cabinet, the liquid station including,
      a cooling liquid circuit for circulating liquid including, sequentially in a downstream direction, a liquid pump, a second heat exchanger, and a valve, and
      a bypass circuit having an inlet arranged, downstream of the pump and upstream of the second heat exchanger, the bypass circuit including a heating resistor and having an outlet connected to the valve;
      a frequency converter cabinet circuit for passing through the frequency converter cabinet and having an outlet connected directly to the valve and an outlet connected to an inlet of the cooling liquid circuit; and
      a drying liquid circuit for passing through the first heat exchanger and, having an inlet connected to the cooling liquid circuit downstream of the second heat exchanger and upstream of the valve, and an outlet connected to the frequency converter cabinet circuit.

2. The cooling and dehumidification system as claimed in claim 1, wherein the air dehumidifier comprises cooling pipes through which the liquid circulates.

3. The cooling and dehumidification system as claimed in claim 1, comprising:
   a discharge pipe for removing water that has condensed on the surface of the air dehumidifier from the frequency converter cabinet.

4. The cooling and dehumidification system as claimed in claim 1, comprising:
   a receiving container arranged below the air dehumidifier, for receiving condensation water; and
   a discharge pipe connected thereto.

5. A cooling and dehumidification system as claimed in claim 1, comprising:
   a condensation water or dew point sensor for arrangement inside the frequency converter cabinet for controlling drying.

6. A method for dehumidifying air in a frequency converter cabinet, comprising:
   positioning an air dehumidifier inside the frequency converter cabinet, the air dehumidifier including a surface to be cooled for condensing humidity thereon, and a first heat exchanger;
   circulating liquid through a liquid station arranged outside the frequency converter cabinet, the liquid station including a cooling liquid circuit for circulating liquid including, sequentially in a downstream direction, a liquid pump, a second heat exchanger, and a valve; and
   circulating the liquid through a bypass circuit having an inlet arranged downstream of the pump and upstream of the second heat exchanger, the bypass circuit including a heating resistor, and having an outlet directly connected to the valve;
   circulating liquid through a frequency converter cabinet circuit for arrangement through the frequency converter cabinet and having an inlet connected to the valve and an outlet connected to the cooling liquid circuit; and
   circulating liquid through a drying liquid circuit to pass the liquid through the first heat exchanger, the drying liquid circuit having an inlet connected to the cooling liquid circuit downstream of the second heat exchanger and upstream of the valve and an outlet connected to the frequency converter cabinet circuit.

7. A frequency converter cabinet comprising:
   an air dehumidifier for positioning inside the frequency converter cabinet, the air dehumidifier including a surface to be cooled for condensing humidity thereon, and a first heat exchanger;
   a liquid station, for arrangement outside the frequency converter cabinet, the liquid station including,
   a cooling liquid circuit for circulating liquid including, sequentially in a downstream direction, a liquid pump, a second heat exchanger and a valve, and
   a bypass circuit having an inlet arranged, downstream of the pump and upstream of the second heat exchanger, the bypass circuit including a heating resistor and having an outlet connected to the valve;
   a frequency converter cabinet circuit passing through the frequency converter cabinet and having an outlet connected directly to the valve and an outlet connected to an inlet of the cooling liquid circuit; and
   a drying liquid circuit for passing through the first heat exchanger and, having an inlet connected to the cooling liquid circuit downstream of the second heat exchanger and upstream of the valve, and an outlet connected to the frequency converter cabinet circuit.

* * * * *